United States Patent [19]

Cotner et al.

[11] 3,775,644

[45] Nov. 27, 1973

[54] ADJUSTABLE MICROSTRIP SUBSTRATE HOLDER

[75] Inventors: Calvin Buchanan Cotner, Arlington, Va.; Arthur Frederick Standing, Rockville, Md.

[73] Assignee: Communications Satellite Corporation, Washington, D.C.

[22] Filed: Sept. 20, 1972

[21] Appl. No.: 290,668

[52] U.S. Cl. . 317/101 CC, 29/203 B, 269/321 WE, 324/158 F, 333/84 M

[51] Int. Cl. .......... H05k 1/04

[58] Field of Search .......... 324/158 F; 29/203 B, 29/203 J; 269/321 WE, 111–119; 333/84 M; 317/101 CC, 101 DH

[56] References Cited

UNITED STATES PATENTS

| | | | |
|---|---|---|---|
| 3,662,318 | 5/1972 | Decuyper | 333/84 M |
| 3,395,439 | 8/1968 | Palesi et al. | 29/203 B |
| 2,844,250 | 7/1958 | Bayha et al. | 324/158 F |

*Primary Examiner*—David Smith, Jr.
*Attorney*—Richard C. Sughrue et al.

[57] ABSTRACT

An adjustable substrate holder comprising a rectangular frame for holding at least one microstrip substrate for testing. Rails are connected to the frame along its outer edges for slidably mounting substrate clamps and electrical connector brackets. A plurality of frames may be mounted side-by-side with extended rails to hold the frames together, to accommodate an equal plurality of substrates. In such a case, the substrates are butted together and electrically interconnected by a bond across them. A continuous ground plane is formed under the substrates when two or more substrates are butted together.

10 Claims, 4 Drawing Figures

ADJUSTABLE MICROSTRIP SUBSTRATE HOLDER

BACKGROUND OF THE INVENTION

1. Field of the Invention

This invention relates to an adjustable holder for testing microstrip substrates, and more particularly to such a holder which can accommodate substrates of various sizes and circuit configurations.

2. Description of the Prior Art

The prior art microstrip substrate test holders have been of two main types, one type has a deep frame fitted with top and bottom plates. The interior dimensions of the frame are the width and length of the substrate to be tested and an inside lip is provided to support the substrate. A hole pattern is drilled into the frame having the desired connection configuration for the mounted substrate. In this type of holder, when a substrate having different dimensions or circuit configurations is to be tested, a completely new holder having the necessary dimensions must be prepared with appropriate holes drilled in its frame to provide electrical connections to the new circuit configuration.

Another type of prior art microstrip substrate holder comprises a metal block having tapped holes drilled around its periphery for mounting connector brackets. Again, such a holder can only accommodate a substrate of given dimensions and circuit configuration, and a unique, single purpose holder must be prepared for each differently dimensioned or configured substrate to be tested.

The above prior art devices also have the disadvantage that several substrates cannot be easily butted together for joint testing, and connecting to the underside of the substrate, for bias monitor points, etc., is impossible.

SUMMARY OF THE INVENTION

The present invention relates to a substrate holder which overcomes the above disadvantages found in prior art holders. A hollow, rectangular frame is used to hold the substrate. Rails are secured around the outer periphery of the frame and if a plurality of frames are employed extended side rails may be used to hold the frames together. Substrate clamps are slidably mounted on the rails and may be positioned anywhere along the periphery of the substrate. A connector bracket, also slidably mounted on the rails, is used to make the necessary electrical connections to the substrate being tested. The connector bracket is spring biased with respect to the rail so that it may be easily moved along the periphery of the substrate, which enables the holder to be used with a substrate of any electrical configuration.

As mentioned above, a plurality of substrates may be tested together by mounting an equal plurality of frames side-by-side. The adjacent edges of the substrates are butted together and a bond is made to properly connect the electrical configuration on one substrate to that on the next adjacent one. If microstrips are used, the butting together forms a continuous ground plane on all of the contiguous substrates.

The clamps and connector bracket each include set screws for raising and lowering them with respect to the top of the frame so that substrates of various thickness can be accommodated in the holder.

It is, therefore, the primary object of this invention to provide an adjustable substrate holder which may be used with substrates of various sizes and electrical configurations.

It is a further object of this invention to provide an adjustable substrate holder which facilitates the coupling together of a plurality of substrates such that the contiguous substrates abut each other to facilitate electrical interconnections along their mating edges.

It is still a further object of this invention to provide an adjustable substrate holder which is particularly useful with microstrips, wherein the individual microstrips are butted together in such a manner that a continuous ground plane is formed.

DESCRIPTION OF THE PREFERRED EMBODIMENT

Figure 1:
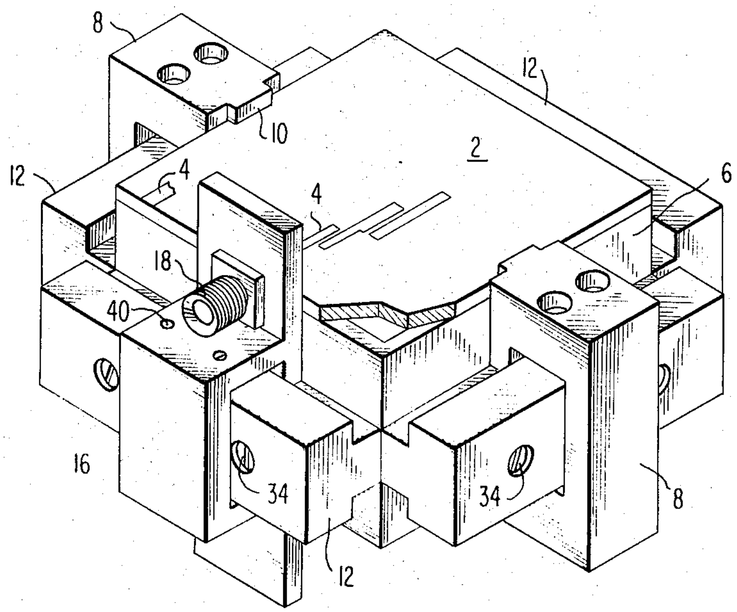
FIG. 1 is a perspective view of the preferred embodiment of the present invention showing a single substrate held by the substrate holder.

Referring to FIG. 1, a substrate 2 carrying an electrical circuit configuration 4 is mounted on top of a frame 6 in the form of a hollow rectangle. Four rails 12 are fixed to the four outer sides of the frame 6. Clamps 8 each have a projection 10 which extends over the substrate 2 and holds it firmly against the top of frame 6. A pair of clamps 8 are shown in FIG. 1 slidably mounted on two of the opposite rails 12 and are set in position and clamped down onto substrate 2 by means of set screws 46,48 visible in FIG. 4. As can be seen, each of the clamps 8 can be moved to any position along a side of the substrate 2 prior to the tightening of the set screws.

A connector bracket 16 is also slidably mounted on one of the rails 12. The connector bracket includes an electrical connector, such as coaxial cable connector 18, which connects a coaxial cable to electrical configuration 4 on substrate 2 via contact tab 20, shown in FIG. 3. If substrate 2 were replaced with a new substrate having an electrical contact strip 4' rather than 4, the connector bracket 16 would be slid on its rail 12 to a position where the connector 18 would contact the strip 4'.

Figure 2:
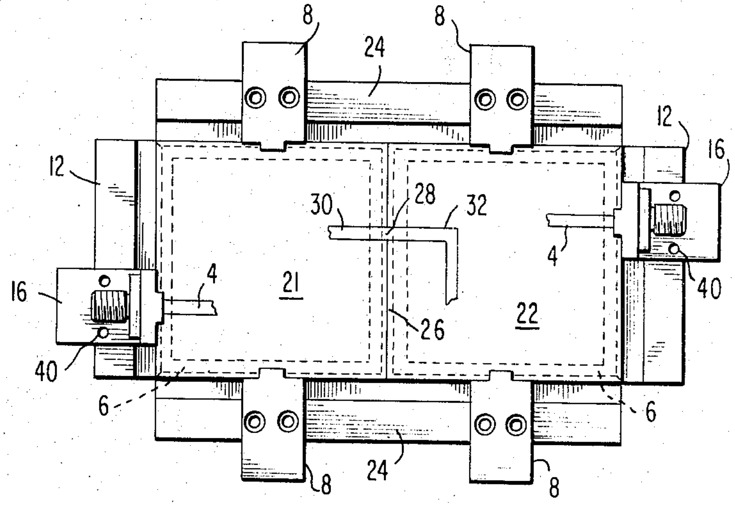
FIG. 2 is a plan view of an alternate embodiment wherein two substrates are held in an abutting relationship.

In FIG. 2, two substrates 21 and 22 are interconnected using the substrate holder of the present invention. Two frames 6 are mounted side-by-side and held together by extended side rails 24. Clamps 8 mounted on the rails 24 are used to clamp the substrates to their respective frame members. Where the substrates abut each other along line 26, an electrical bond 28 is formed between the electrical configuration 30 and 32 on each of the two substrates. In this manner, the two substrates are electrically interconnected. Connector brackets 16 may be appropriately positioned to make electrical connections to the substrates. If the substrates are microstrips, then the ground planes on the underside of the microstrips are interconnected by a bonding operation on the conducting frame to form a continuous ground plane.

Figure 3:
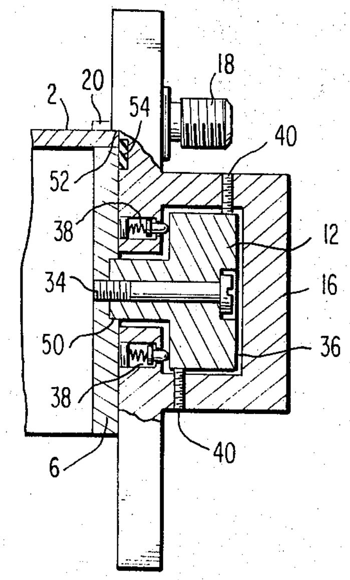
FIG. 3 is a cross-sectional view of the connector bracket employed.

FIG. 3 is a cross-sectional view of the connector bracket used in the invention. Rail 12 is fixed to frame 6 by means of screws 34 and positioned by slot 50 in frame 6. Connector bracket 16 has an opening 36 which fits around rail 12 such that the connector bracket is slidably mounted on the rail. Detent springs 38 bias the connector bracket against the rail to such a degree that the bracket may be slid along the rail to the desired position and aid in positioning the bracket against the frame. Offset set screws 40 are used to raise and lower the connector bracket with shoulder 52 and the extending contact tab 20 so that substrates of varying thickness may be held tightly against the frame. Compressible conductive gasketing 54 aids in maintaining good electrical contact at the frame-bracket interface.

Figure 4:
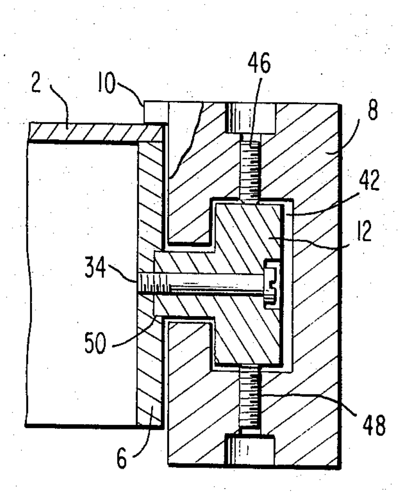
FIG. 4 is a cross-sectional view of one of the clamps.

FIG. 4 shows a clamp 8 used in the invention having an opening 42 which fits over a rail 12. When clamp 8 has been mounted on the rail set screws 46 and 48 are tightened against rail 12 to hold the clamp securely to the rail. By the proper adjustment of screws 46 and 48, protrusion 10 may be raised or lowered in order to accommodate substrates of various thicknesses.

Although the above descriptions encompass the preferred embodiments of the present invention, it is clear that various modifications can be made by persons skilled in the art without departing from the boundaries and scope of the invention. Accordingly, the merits of the present invention should be measured solely from the following claims.

What is claimed is:

1. An adjustable substrate holder comprising:

a. a hollow, rectangular frame for holding at least one substrate;

b. rail means secured to the outer periphery of the frame;

c. at least one clamp adjustably mounted on the rail means for clamping the substrate to the frame; and d. at least one connector bracket adjustably mounted on the rail means for making an electrical connection to the substrate.

2. The adjustable substrate holder as set forth in claim 1 wherein the frame has an open top and bottom.

3. The adjustable substrate holder as set forth in claim 1 wherein the frame includes a plurality of frame members mounted side-by-side and the rail means includes at least one rail secured to all of the frame members.

4. The adjustable substrate holder as set forth in claim 3, wherein a plurality of substrates are mounted side-by-side on the frame and are electrically interconnected by a bond across their abutting edges.

5. The adjustable substrate holder as set forth in claim 4, wherein the substrates are microstrips and a continuous ground plane is formed under the substrates by the butting together of adjacent substrates.

6. The adjustable substrate holder as set forth in claim 1, wherein the clamp is laterally slidable on the rail means and includes means for setting the clamp at a particular position along the rail means for vertically adjusting the clamp with respect to the frame, whereby substrates of different dimensions may be securely held to the frame.

7. The adjustable substrate holder as set forth in claim 1, wherein the connector bracket is laterally slidable on the rail means and includes an extending contact tab for making an electrical connection to the substrate.

8. The adjustable substrate holder as set forth in claim 7, wherein the connector bracket includes means for spring biasing the connector bracket against the rail means.

9. The adjustable substrate holder as set forth in claim 8, wherein the connector bracket includes means for vertically adjusting the bracket with respect to the frame to accommodate substrates of different thicknesses.

10. The adjustable substrate holder as set forth in claim 8, wherein the substrate is a microstrip and the connector bracket includes a coaxial cable connector and means for electrically contacting the ground plane of the microstrip.

* * * * *